June 14, 1966 W. GERLACH 3,256,470

CONTROLLABLE SEMI-CONDUCTOR DEVICE

Filed May 8, 1963

Jnventor:
WILLI GERLACH
By Toulmin & Toulmin
Attorneys

United States Patent Office 3,256,470
Patented June 14, 1966

3,256,470
CONTROLLABLE SEMI-CONDUCTOR DEVICE

Willi Gerlach, Frankfurt am Main-Eschersheim, Germany, assignor to Licentia Patent-Verwaltungs-G.m.b.H., Frankfurt am Main, Germany Filed May 8, 1963, Ser. No. 278,860
Claims priority, application Germany, May 10, 1962, L 41,961
12 Claims. (Cl. 317—235)

The present invention relates to a controllable semi-conductor device of the npnp type having the following configuration. There is a wafer of single crystal semiconductive material, for example, silicon and having three parallel layers of respectively adjoining opposite type conductivity, thus forming two p–n junctions in-between two respective adjoining layers. No contact is being made with the middle layer. Ohmic contact is being made by a metallic electrode with one of the two outer layers. A second metallic electrode makes ohmic contact in a central wafer surface region of the other outer layer, and a third, but a p–n junction forming contact is being made in a ring-shaped area around the said central region. Aside from this latter p–n junction, this third electrode makes also ohmic contact with the immediate semi-conductor material beneath thereof.

It is an object of the present invention to improve the semi-conductor device of this type, and particularly to reduce the electrical power requirements for operating such a device as switch while rendering the control current required for such switching action less temperature dependent.

According to one aspect of the present invention, in a preferred embodiment thereof, the following semi-conductor device is suggested.

There first is a wafer of semi-conductor material and including three parallel layers, with two respectively adjoining layers being of opposite type conductivity. There is thus an inner layer and two outer layers. One outer layer is to make ohmic contact preferably over a large surface area with a first metallic electrode.

The other outer layer carries a second electrode disposed thereon so as to make ohmic contact with the semi-conductor material immediately beneath thereof, but this latter semi-conductor material defines a zone of conductivity which is opposite to that of this other layer. Thus far, there is provided a pnpn wafer with electrodes making ohmic contact at its respective opposite sides. A control electrode further makes contact at the free surface of said other outer layer carrying otherwise the said second electrode. A metallic annulus or annular piece constituting an auxiliary electrode is additionally disposed on this latter surface, surrounding both, the said second electrode and the control electrode and making ohmic contact with the material beneath thereof. Second electrode and auxiliary electrode are interconnected by a metal bridge not contacting any semi-conductor material.

While the specification concludes with claims particularly pointing out and distinctly claiming the subject matter which is regarded as the invention, it is believed that the invention, the objects, and features of the invention and further objects, features and advantages thereof will be better understood from the following description taken in connection with the accompanying drawing in which:

Figure 1:
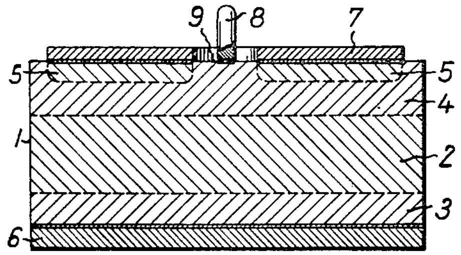
FIGURE 1 illustrates in cross-sectional view a known controllable semi-conductor device of the pnpn type.

Proceeding now to the detailed description of the drawing, there is shown in FIGURE 1 a known silicon controlled rectifier.

In this known controlled silicon rectifier of the construction shown in part schematically in FIGURE 1, a silicon disc or wafer 1 comprises a first layer 2 of the n-type conductivity, with layers 3 and 4 of p-type conductivity contacting it on opposite sides thereof. One of these p-type layers 4 carries on its open surface side a ring-shaped layer 5 of n-type conductivity. The silicon wafer 1 has the remote side of layer 3 attached to a metallic carrier 6 to serve as an anode. A ring-shaped electrode 7 makes ohmic contact with the ring-shaped layer 5 as a cathode. A control electrode 8 contacts the layer 4 within the region enclosed by the ring-shaped layer 5.

The dashed lines between layers 3 and 2, 2 and 4, 5 and 4 denote p–n junctions.

A controllable semi-conductor device of this type is connected in an electric circuit by means of the anode, cathode and control electrode terminals in such a manner that the controlled current flows between the anode and the cathode terminals through the semi-conductor wafer body; the control current flows through the semi-conductor between the control electrode 8 and the cathode 7. The control current has such a direction that charge-carriers will flow from the control electrode 8 into the layer 4 to which the control electrode is attached.

When no charge-carrier current passes through the control electrode 8, the semi-conductor device offers a high ohmic resistance to a current between the electrode 6 and the electrode 7 flowing in either direction. When such a charge-carrier control current does enter the semi-conductor body, there will still be a high resistance for a cathode-to-anode current (with the anode being negatively biased relative to the cathode) but only a low resistance is offered to an anode-to-cathode current (with the anode now being positively biased and the cathode negative correspondingly).

The injection of a charge-carrier current from the control electrode into its adjoining semiconductive material increases the current through the p–n junction (4–5) at the cathode 7 by causing the controllable semi-conductor device to acquire a lower resistance as between anode 6 and cathode 7 and to require a lower break through voltage from the anode to the cathode.

The invention will now be explained more fully with reference to FIGURES 2 to 5. A first embodiment is shown in FIGURES 2 and 3.

Figures 2, 4:
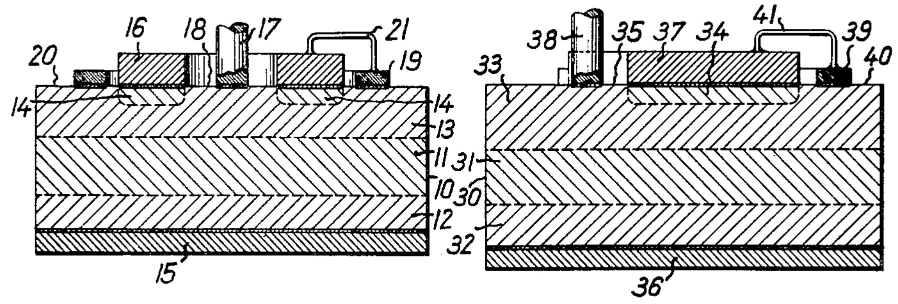
FIGURES 2 and 3 illustrate respectively cross-sectional and top elevation of a first embodiment of the invention.
FIGURES 4 and 5 illustrate respectively cross-sectional and top elevation of a second embodiment of the invention.
Figure 3:
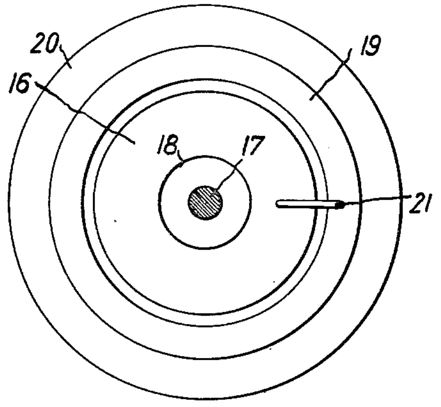

FIGURE 2 shows a cross-sectional, partly schematic form of an improved semiconducting body with its metallic electrodes, and FIGURE 3 shows a plan view, also partly in cross-section of the same construction.

There is first a semiconductor body denoted in general with reference numeral 10 and comprising a single crystal wafer or silicon having a n-type conducting central layer 11, a p-type conducting outer layer 12 on the lower side, in the drawing, of layer 11 parallel thereto, and another p-type conducting outer layer 13 on the other side of layer 11 and extending also parallel thereto. A still parallel n-type conducting zone or layer 14 adjoins the upper surface side of layer 13, without bordering against the first layer 11. Layer 14 has the form of an annular disc.

Again, the dashed lines in body 10 indicates p–n junctions therein. There are, in particular, two parallel p–n junctions extending parallel to the upper and lower surfaces of wafer 10. The third p–n junction is trough shaped traversing the upper surface 20 of wafer 10 in two concentrical circles.

An electrode 15 makes ohmic contact with layer 12 and comprises, for example, a circular aluminum disc of soldered-on aluminum or fused to the semi-conductor material at layer 12. Disc 15 serves as an anode electrode. The cathode terminal is a fused metallic electrode 16 making ohmic contact with annular zone or layer 14 and consisting, for example, of gold with some antimony added thereto. The annular, n-type conducting layer zone 14 actually is being formed when metal electrode 16 is alloyed and fused to the top side of p-type layer 13.

Inner and outer diameter of annular electrode 16 are respectively similar to inner and outer diameter of annular layer zone 14, that is to say, that the outer, lower circular edge of electrode 16 outlines a circular contour on surface 20 approximately coinciding with the p–n junction 14–13 where reaching the surface 20 at the aforementioned outer circle. The lower inner edge of electrode 16 likewise coincides with the smaller, second circle defined where trough shaped p–n junction 14–13 reaches again surface 20.

A control electrode pin 17 of gold with boron added is fused to the center of surface 20 and makes ohmic metallic contact with layer 13; the annular recess of cathode 16 is denoted with numeral 18. Thus, control electrode 17 makes contact with wafer 10 within a circular recess of main electrode 16.

A ring-shaped electrode 19 comprising gold with boron added is fused with and alloyed to the wafer surface 20 still on the free and upper surface 20 of the wafer 10 at layer 13, and extending around the annular and disc-shaped layer 14 so as to surround and enclose the layer 14 as well as electrode 16. This ring 19 constitutes an auxiliary electrode which is connected with the main electrode 16 by a U-shaped conductor traverse 21 which does not make contact with the silicon wafer body anywhere.

The circular area wherein control electrode 17 contacts surface 20 may have a diameter of about 2 mm. It is advantageous to provide for a distance of about 250 $\mu$ between this circular area of contact of the control electrode and the inner periphery of the annular disc-shaped layer 14, which is the inner circle of p–n junction 14–13 appearing at surface 20. The layer zone 14 may then have a width of about 5 mm. and the ring 19 a width of about 0.5 mm., measured in radial direction. The distance also measured in radial direction between the ring zone 14 and the auxiliary electrode 19 being about 250 $\mu$; that is to say, that the inner lower edge of ring 19 is about 250 $\mu$ from the outer circle with which p–n junction 14–13 reaches surface 20.

The illustrated embodiment of FIGURES 2 and 3, actually includes the following modification: The central layer 11 of the silicon wafer 10 may be p-type conductive instead of n-type conductive. The lower layer 12 will then be of n-type conductivity and the upper layer 13 will also be of n-type conductivity; the layer 14 will be of p-type conductivity accordingly.

In this case, the electrode 15 making ohmic metallic contact with layer 12 is, for example, a gold plate with some antimony added and being alloyed and fused to layer 12 now serving as the cathode. The annular electrode 16 making ohmic and metallic contact with layer zone 14 is, for example, a ring of gold with some boron added and being fused and alloyed to layer 14 now serving as an anode. The p-type conducting layer zone 14 itself will again be formed upon the now n-type conducting layer 13 during the fusing and alloying of the electrode 16 of gold with boron added onto this layer 13.

The electrode 17 making ohmic, metallic contact with layer 13 is, for example, a gold pin with antimony added, and being alloyed to layer 13 so as to serve as a control electrode. The auxiliary electrode 19 making ohmic, metallic contact with layer 13 is alloyed thereto and comprising a ring of gold with antimony added. There is a connection to terminal 16 by means of conductor 21 as aforedescribed.

It appears from the foregoing that in this embodiment of the invention the particular novel feature thereof is constituted by a metallic electrode in the form of a ring which encloses and surrounds a ring-shaped layer 14 while contacting the surface of an opposite-type conductivity layer 13 which forms a trough shaped p–n junction with the ring-shaped layer 14, the metallic ring-shaped auxiliary electrode is then connected by a metallic conductor with the metallic electrode which makes ohmic contact with the surface side of this ring-shaped layer 14.

This embodiment includes the following preferred configuration:

| | | |
|---|---|---|
| Electrode 15 | Aluminum | Gold-antimony. |
| Layer 12 | Silicon, p-type | Silicon, n-type. |
| Layer 11 | Silicon, n-type | Silicon, p-type. |
| Layer 13 | Silicon, p-type | Silicon, n-type. |
| Layer 14 | Silicon-antimony, n-type. | Silicon, boron p-type. |
| Electrodes 17, 19 | Gold-boron | Gold-antimony. |
| Electrode 16 | Gold-antimony | Gold-boron. |

It appears that the electrodes 16 and 19 which are interconnected by a traverse 21 are comprised primarily of gold, but they have different additives, since the semi-conductor material respectively beneath thereof is of opposite type material. Thus, traverse 21 may be of any metal, but it must not contact any semi-conductor material, that is to say, that any of the metal forming ring 19 must not contact layer zone 14.

Figure 5:
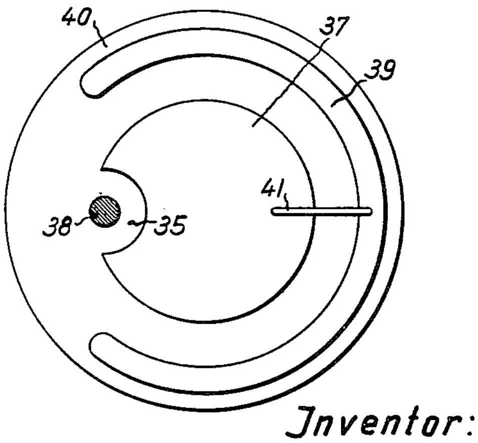

Proceeding now to the next embodiment of the invention, particularly FIGURES 4 and 5.

FIGURE 4 thereof shows a partly schematic cross-sectional view of another form of semi-conductor body with its electrodes making ohmic, metallic contact for use as a controllable semi-conductor device, and FIGURE 5 shows a plan view thereof, also partly in cross-section.

The semi-conductor body 30 comprises a single crystal wafer, for example, silicon having an n-type conducting layer 31, a first p-type conductive layer 32 parallel to layer 31 and on one side thereof, and another p-type conductive layer 33 parallel to both layers 31 and 32 and on the other, here the upper side of layer 31, and a peripherally notched disc-shaped n-type conducting layer zone 34 disposed on the outer surface of layer 33 and not bordering on layer 31.

Again, the dashed lines in FIGURE 4 illustrate schematically p–n junctions between layers 32 and 31; 33 and 31; 33 and 34. The p–n junction 33–34 reaches the wafer surface 40 in a notched circle.

An electrode 36 is mounted on the outer, here lower wafer surface pertaining to layer 32 and making metallic and ohmic contact therewith. Electrode 36 may, for example, be made of a circular disc consisting of gold with boron added or of aluminum. This electrode 36 serves as an anode terminal.

Further ohmic metallic contact is made by a flat disc-shaped element 37 of gold with some added antimony and serving as cathode. Disc 37 has a notch 35 and the lower edge of disc 37 coincides approximately with the notched circle described by the p–n junction 33–34 where reaching the wafer surface 40.

The circular, notched n–type conducting layer zone 34 is actually produced on the outer surface side of the layer 33 by and during the fusing and alloying thereon the gold-antimony electrode disc 37.

An electrode pin 38 of aluminum or of gold with boron added is fused to surface 40 to make ohmic contact with layer 33 and serving for instance as control electrode. The contact is made and located within the notch 35 of both, layer 34 and electrode disc 37 on the wafer surface 40 of layer 33.

As specific feature of this embodiment of the invention, another auxiliary electrode 39 makes ohmic,– metallic contact with layer 33. Electrode 39 comprises an aluminum annulus section being fused onto the remote wafer surface 40 along the circumference thereof and extending parallel to the periphery of cathode terminal 37. This annulus section 39 may alternatively consist of gold with boron added or of aluminum and is connected with the cathode electrode 37 by means of a metallic conductor 41 which does not touch the surface of the silicon body 30. The missing section to complete an annulus does cover notch 35. The distance from annulus 39 to the concentrical lower edge is uniform.

With the control electrode pin 38 having a diameter of about 2 mm., it is advantageous to leave a space of about 250 $\mu$ between its periphery where contacting surface 40 and the inner semicircular periphery of notch 35. The notched-disc-shaped layer 34 preferably has a diameter of about 10 mm., the space between its circular periphery and the inner, also circular concentrical periphery of the ring 39 will preferably be about 250 $\mu$, and the width of ring 39 is preferably about 0.5 mm. The smallest distance between the control electrode 38 where contacting surface 40 and the adjacent, closest edge of the ring 39 where contacting surface 40 should be greater than about 1.5 mm.

The control electrode 38 is sufficiently far from both electrode 39 and electrode 37 but not too far, for the following reason: The portion of the leakage current (in case of back bias of junction 31–33) which is due to a temperature increase, must be drawn off by way of this auxiliary electrode 39 without increasing the forward bias of the junction 33–34 so as to avoid an increase in the injection of the junction 33–34.

The ring-shaped auxiliary electrode 39 extends around about ¾ of the periphery of the disc 37 which does not include the notch 35.

FIGURES 4 and 5 actually incorporate another embodiment constituting a modification of the device as described above.

The first layer 31 of the silicon wafer 30 can be made p-type conducting instead of n-type conducting. The layers 32 and 33 are then n-type conducting and the layer zone 34 is p-type conducting. The electrode 36, which is to make ohmic, metallic contact with the semi-conductor material beneath thereof then serves as a cathode and is an alloyed contacting electrode comprised of, for example, gold with antimony. The electrode 37 now serves as an anode and is an alloyed contacting electrode comprised of, for example, aluminum, and the electrode 38 as the control electrode is comprised of, for example, gold with antimony fused to layer 33 as aforedescribed. The additional, i.e., auxiliary electrode 39 makes fused ohmic contact and is comprised of, for example, gold with antimony. Electrode 39 is connected with the anode terminal 37 by a conductor 41 as aforedescribed.

From the foregoing description it will be apparent that this embodiment of the invention as described in connection with FIGURES 4 and 5 consists of a controllable semi-conductor wafer comprised of a single crystal semi-conductor body in which there is a first layer of one type of conductivity, each side of which is contacted by a layer of the opposite type conductivity; one of the latter layers has on its outer surface side a layer zone of the same type conductivity as the first mentioned layer but not being in contact therewith, and having the form of a disc with a notch in its periphery.

An ohmic metallic contact is made between a first main electrode and the opposite type layer which does not carry the notched-disc layer; another ohmic, metallic contact is made between a second main electrode and the notched-disc layer; a third ohmic, metallic contact is made by a control electrode with that layer which carries the notched-disc layer and this third electrode makes contact in the area of the notch. The last mentioned third electrode serves as a control electrode.

If the first layer is of the n-type conductivity, then the first electrode, which contacts the opposite-type layer not carrying the notched disc, will serve as an anode, while the electrode that is making contact with the notched disc layer will serve as a cathode.

On the other hand, if the first layer is of the p-type conductivity, then the first of the aforesaid electrodes will serve as cathode and the second one as an anode.

The main feature of this invention relating to this controllable semi-conductor device comprises in another, auxiliary electrode making ohmic, metallic contact with the outer surface side of the said opposite type layer in the area surrounding the notched disc layer but not completely enclosing the latter, said auxiliary electrode being connected by a metallic conductor with the electrode having the notch.

A controllable semi-conductor device according to this invention has the advantage over the usual analog controllable silicon rectifiers in being able to operate with smaller electric control currents for switching the rectifier on. Also, the novel device is less temperature-sensitive in relation to the minimum turn over current that is necessary to put it into operation.

Especially advantageous is the controllable semi-conductor device in accordance with this invention in which the auxiliary electrode making ohmic, metallic contact, the anode, the cathode and the control electrodes are all fused metal alloy connections, and wherein the one particular layer zone such as 14 in FIGURE 2 and 34 in FIGURE 4 is formed by fusing and alloying a similar shaped electrode in place. If this layer zone 14 or 34 is n-type, then this electrode (16 or 37) would be the cathode whereas if it is p-type then this electrode would be the anode.

In order to appreciate the advantage resulting from the invention, the following should be considered. Suppose the layer 13 or 33 is of n-type conductivity so that layer 14 or 34 is to be of the p-type conductivity; it is now impossible to short circuit, by way of direct metallic contact, the p–n junction 14–13 or 34–33 for the following reason: Electrodes 19 and 16 as well as electrodes 37 and 39 are to make ohmic contact with the layers beneath them. This means that the metal used for electrode 19 or 39 has to be of a type of material which will act so as to dope the layers beneath them to n-type conductivity when these electrodes are fused to their respective layers, while the metal to be used for electrodes 16 or 37 will have to be of a type of material which will act to dope the layer beneath them to p-type conductivity when these electrodes are fused to their respective layers. Thus, one cannot use the same metal for electrodes 16 and 19 or for electrodes 37 and 39. If one were to use the same metal for electrodes 16 and 19 or 37 and 39 electrodes 19 and 39 would form additional layers of the same conductivity type as layers 14 and 34, respectively, thereby creating an additional p–n junction in each device, so that an ohmic contact would be formed only with one layer forming each of the resulting p–n junctions. Of course, the situation is similar if the conductivity types were reversed. The invention avoids such disadvantage.

It will be appreciated that FIGURES 3 and 5 are capable of another interpretation, if one disregards the hatching shown for electrodes 17 and 38. These figures show the wafer surface (20 or 40) outlining the contact areas thereon resulting from the several electrodes; there being annular contact areas such as 19 and 16, circular contact areas such as 17 and 38, the annulus section area 39 and the notched-disc area 37. All of the various distances and widths given above refer to distances and dimensions of and between these contact areas. Also, annulus 16 in FIGURE 3 shown as two concentrical circles outlines where the p–n junction 13–14 reaches surface 20.

The distance between contacting areas of auxiliary electrode and one main electrode; namely, of concentrical electrodes 19 and 16 or between the contacting areas of electrodes 37 and 39 at one side of the respective contacting wafer surfaces and measured in radial direction thereon, is about 0.1 to 0.5 mm. and the contacting areas of control electrode and this main electrode (17–16 or 38–37) are apart by a distance of similar dimension. The width (also measured in radial direction) of the contacting areas of electrode 19 or 39 is about 0.5 to 1 mm. This enables efficient utilization of the surface 20 or 40 of wafer 10 or 30. Also, measured in radial direction, the ring electrode 16 is about 4 to 6 mm. wide, disc 37 has preferably a diameter of 4 to 10 mm. The zones beneath thereof have similar dimensions measured in direction of the surface planes.

Figure 6:
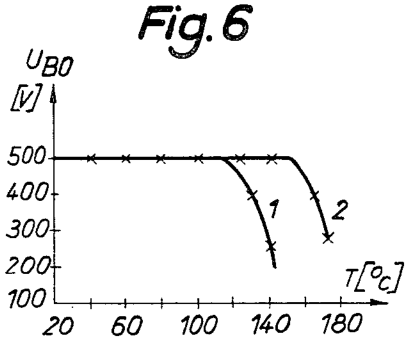
FIGURE 6 illustrates an example of the attainable decrease in temperature dependency of the controllable semi-conductor cells according to the present invention.

The intensities of the sweep voltage, that is the value of the voltage applied between the anode and the cathode in case of a positive anode and a negative cathode as well as without any control voltage, at which the controllable semi-conductor cell passes over from a state of high resistance into a conductive state are measured as a function of the temperature of the controllable semi-conductor cells on a controllable semi-conductor cell according to the invention and on another similar controllable semi-conductor cell which is, however, not constructed according to the invention. The results of these measurements performed on the controllable semi-conductor cells described hereinafter, are illustrated in the graph of FIGURE 6. The abscissa indicates the temperature T in ° C. and the ordinate the sweep voltage $U_{30}$ in volts. Curve 1 illustrates the temperature dependency of a controllable semi-conductor cell not constructed according to the present invention and curve 2 shows the temperature dependency of a controllable semi-conductor cell constructed according to the invention.

It can be seen from the curve of the temperature dependency of the measured controllable semi-conductor cells represented by curves 1 and 2 that the sweep voltage of the semi-conductor cell controllable according to the present invention has a temperature independent value up to an increase of temperature by 40° C. as compared with the temperature of the other semi-conductor cell. The measured controllable semi-conductor cell represented by curves 1, which is partly described in connection with FIGURES 4 and 5, is constructed as follows:

The semi-conductor body 30 comprising a single crystal wafer is made of silicon and comprises a first n-conductive layer 31, p-conductive layers 32 and 33 and one n-conductive layer 34. The cathode junction 37 consists of an alloyed contact of gold with some antimony added, whereas the anode junction 36 is an alloyed contact of aluminum, and the controlling electrode pin 38 is an alloyed contact of gold with boron added thereto. The n-conductive layer 34 is shaped like a circular disk provided with a recess at one point of its periphery. The controlling electrode pin 38 makes contact with the p-conductive layer 33 at the portion of its surface positioned at the peripheral recess of the n-conductive layer 34 and being turned away from the layer 31.

The measured controllable semi-conductor cell represented by curve 2 is similarly constructed and comprises according to the invention, as described in connection with FIGURES 4 and 5, another ohmic metallic junction 39, consisting of an alloyed contact of gold with an addition of boron in the form of an annular member, which so makes contact with the p-conductive layer 33 of its surface portion 40 surrounding the n-conductive layer 34, that the n-conductive layer 34 is encompassed but not the recess 35, said annular piece 39 being connected with the cathode junction 37 by means of a metallic conductor 41 which does not contact the surface of the silicon body 30.

The invention is not limited to the embodiments described above but all changes and modifications thereof not constituting departures from the spirit and scope of the invention are intended to be covered by the following claims:

What is claimed is:

1. Controllable semi-conductor device comprising: a single crystal semi-conductor wafer having first, second and third parallel layers with the first and second layers forming a p–n junction and the second and third layers forming another p–n junction, said first and third layer being of similar type conductivity; a first main electrode making ohmic metallic contact with said first layer only; a second main electrode disposed on said third layer, there being a layer zone beneath said second main electrode being of similar type conductivity as that of said second layer and extending into said third layer, so as to form a third p–n junction therewith, said second main electrode making metallic ohmic contact with said zone beneath thereof, said third p–n junction intersecting the wafer surface at a contour line approximately coinciding with the contour line outlined by the area wherein the second main electrode contacts the wafer surface, said second main electrode having a recess, there being a free surface of said third layer at said recess; a control electrode making ohmic metallic contact with said third layer at a wafer surface area in said recess; an auxiliary electrode displaced from said second electrode and disposed on said third layer and making metallic ohmic contact therewith; the area of contact between said auxiliary electrode and said third layer at least partially surrounding the said contact area of said second electrode; and a metallic connection interconnecting said auxiliary electrode and said second main electrode without contacting any semi-conductor material pertaining to said wafer.

2. Controllable semi-conductor device comprising: a single crystal semi-conductor wafer having first, second and third parallel layers with the first and second layers forming a p–n junction and the second and third layers forming another p–n junction, said first and third layer being of similar type conductivity; a first main electrode making ohmic metallic contact with said first layer only; a second main electrode comprising a metallic annulus on said third layer and having a circular recess, there being an annular layer zone in said third layer, beneath said second annular electrode and making metallic ohmic contact therewith, said annular zone forming a trough shaped, third p–n junction with said third layer and having a conductivity type similar to that of said second layer, said third p–n junction intersecting the wafer surface at two concentrical lines approximately coinciding with the contour lines outlining the area wherein the second main electrode contacts the wafer surface; a metallic control electrode making ohmic contact with said third layer at an area in said circular recess; an annular, metallic auxiliary electrode displaced from said second electrode and disposed on said third layer, and making ohmic contact therewith at an area surrounding said second electrode contacting area; and a metallic connection interconnecting said auxiliary electrode and said second main electrode without contacting any semi-conductor material pertaining to said wafer.

3. Controllable semi-conductor device comprising: a single crystal semi-conductor wafer having first, second and third parallel layers with the first and second layers forming a p–n junction and the second and third layers forming another p–n junction, said first and third layers being of similar type conductivity; a first main electrode making ohmic metallic contact with said first layer only; a second main electrode comprising a notched metallic disc on said third layer, there being a notched-disc-shaped zone in said third layer beneath said disc and making metallic ohmic contact therewith, said notched-disc-shaped zone forming a third p–n junction with said third layer and being of a conductivity type similar to that of said second layer, said third p–n junction intersecting the wafer surface at a contour line approximately coinciding with the contour line of the area wherein the second main electrode contacts the wafer at the third layer thereof; a metallic control electrode making ohmic contact with said third layer at an area in said notch; an auxiliary electrode displaced from said second electrode and displaced on said third layer making ohmic metallic contact with said wafer surface at an area extending along the circumferential margin of said wafer and having the shape of an annulus section, with the interruption of such section being near said notch, said contacting area of said auxiliary electrode extending around the contacting area of said second main electrode disc; and a metallic connection interconnecting said auxiliary electrode and said second main electrode without contacting any semi-conductor material pertaining to said wafer.

4. A controllable silicon rectifier comprising: a single crystal silicon wafer having first, second and third parallel layers with the first and second layers forming a first p–n junction and the second and third layers forming a second p–n junction, said first and third layers being of similar type conductivity; a first metallic electrode making ohmic contact with said first layer only; a second main electrode disposed on said third layer, there being a zone beneath said second electrode having a conductivity type similar to that of said second layer and extending into said third layer, thereby forming a third p–n junction therewith, said second main electrode making metallic ohmic contact with said zone beneath thereof, said third p–n junction intersecting the wafer surface at a contour line approximately coinciding with the contour line outlined by the area wherein the second main electrode contacts the wafer surface, said second electrode having a recess, there being a free surface of said third layer at said recess; a control electrode making metallic ohmic contact with said third layer at an area within said recess; an auxiliary electrode displaced from said second electrode and disposed along the margin of said wafer and making ohmic metallic contact with said third layer at an area thereof at least partially surrounding said contacting area of said second main electrode, any of said electrodes making ohmic contact with p-type silicon comprising gold with boron added or aluminum, any of said electrodes making ohmic contact with n-type silicon comprising gold with antimony added; and a metallic connection interconnecting said auxiliary electrode and said second main electrode without contacting any semi-conductor material pertaining to said wafer.

5. Controllable semi-conductor device comprising: a single crystal semi-conductor wafer having first, second and third parallel layers with the first and second layers forming a p–n junction and the second and third layers forming another p–n junction, said first and third layer being of similar type conductivity; a first main metallic electrode fused to said first layer for making ohmic contact therewith; a second main metallic electrode fused to said third layer, there being a zone of opposite type conductivity in said third layer beneath said second electrode, forming a third p–n junction with said third layer, said third p–n junction intersecting the wafer surface at a contour line approximately coinciding with the contour line outlined by the area wherein the second main electrode contacts the wafer surface at the third layer thereof, said second main electrode making ohmic metallic contact with said zone, said second electrode having a recess, there being a free surface of said third layer at said recess; a metallic control electrode fused to said third layer at an area within said recess for making ohmic contact with said third layer; a metallic auxiliary electrode displaced from said second electrode and fused to said third layer for making ohmic contact therewith at an area thereof extending along the margin of said wafer and at least partially surrounding said contacting area of said second electrode; and a metallic connection interconnecting said auxiliary electrode and said second main electrode without contacting any semi-conductor material pertaining to said wafer.

6. Controllable semi-conductor device comprising: a single crystal semi-conductor wafer having first, second and third parallel layers with the first and second layers forming a p–n junction and the second and third layers forming another p–n junction, said first and third layers being of similar type conductivity; a first main electrode making ohmic metallic contact with said first layer only; a second main electrode comprising a metallic annulus on said third layer having a circular recess, there being an annular zone in said third layer, beneath said second annular electrode and making metallic ohmic contact therewith, said annular zone forming a trough shaped third p–n junction with said third layer and having a conductivity type similar to that of said second layer, said third p–n junction intersecting the wafer surface at a contour line approximately coinciding with the contour line outlining the annular area wherein the second main electrode contacts the wafer surface, said annulus having a width of 4 to 6 mm.; a control electrode making metallic ohmic contact with said third layer at an area within said circular recess; an annular auxiliary electrode displaced from said second electrode and disposed on said third layer and contacting said wafer at an area thereon extending around said annular area at a distance therefrom of 0.1 to 0.5 mm. and having a width of 0.5 to 1 mm., said auxiliary electrode making ohmic metallic contact with said third layer; and a metallic connection interconnecting said auxiliary electrode and said second main electrode without contacting any semi-conductor material pertaining to said wafer.

7. Controllable semi-conductor device comprising: a single crystal semi-conductor wafer having first, second and third parallel layers with the first and second layers forming a p–n junction and the second and third layers forming another p–n junction, said first and third layers being of similar type conductivity; a first main electrode making ohmic metallic contact with said first layer only; a second main electrode comprising a notched metallic disc on said third layer, there being a notched-disc-shaped zone in said third layer beneath said disc and making metallic ohmic contact therewith, said notched-disc-shaped zone forming a third p–n junction with said third layer and being of a conductivity type similar to that of said second layer, said third p–n junction intersecting the wafer surface at a contour line approximately coinciding with the contour line outlining the contact area wherein the second main electrode contacts the wafer surface, said disc having a diameter of 4 to 10 mm.; a control electrode making metallic ohmic contact with said third layer at an area within said notch; an auxiliary electrode displaced from said second electrode and disposed on said third layer making ohmic metallic contact therewith at an area on the wafer surface along the circumferential margin thereof, said latter area having the shape of a semi-annulus with the interruption being near said notch, said auxiliary electrode contact area having a width of 0.5 to 1 mm. and surrounding partially said contacting area of said second main electrode disc at a distance of 0.1 to 0.5 mm. therefrom; and a metallic connection interconnecting said auxiliary electrode and said second main electrode without contacting any semi-conductor material pertaining to said wafer.

8. Device as set forth in claim 7, said auxiliary electrode being a three-quarter annulus.

9. Controllable semi-conductor device comprising: a single crystal semi-conductor wafer having first, second and third parallel layers with the first and second layers forming a p–n junction and the second and third layers forming another p–n junction, said first and third layers being of similar type conductivity; a first main electrode making ohmic metallic contact with said first layer only; a second main electrode comprising a metallic annulus on said third layer having a circular recess, there being an annular zone in said third layer, beneath said second annular electrode and making metallic ohmic contact therewith, said annular zone forming a trough shaped third p–n junction with said third layer and having a conductivity type similar to that of said second layer, said third p–n junction intersecting the wafer surface at two concentrical contour lines approximately coinciding with the contour lines outlining the area wherein said second main electrode contacts the wafer surface at the third layer thereof; a control electrode making metallic ohmic contact with said third layer at a wafer surface area in said circular recess; an annular auxiliary electrode displaced from said second electrode and disposed on said third layer and making ohmic contact with said wafer surface at an area extending around said area of contact of said annulus at a distance therefrom of about one order of magnitude below the width of said area of contact of said auxiliary electrode; and a metallic connection interconnecting said auxiliary electrode and said second main electrode without contacting any semi-conductor material pertaining to said wafer.

10. Controllable semi-conductor device comprising: a single crystal semi-conductor wafer having first, second and third parallel layers with the first and second layers forming a p–n junction and the second and third layers forming another p–n junction, said first and third layers being of similar type conductivity; a first main electrode making ohmic metallic contact with said first layer only; a second main electrode comprising a notched metallic disc on said third layer, there being a notched-disc-shaped zone in said third layer beneath said disc and making metallic ohmic contact therewith, said notched-disc-shaped zone forming a third p–n junction with said third layer and being of a conductivity type similar to that of said second layer, said third p–n junction intersecting the wafer surface at a contour line approximately coinciding with the contour line outlining the area wherein the second main electrode contacts the wafer surface at the third layer thereof; a control electrode making metallic ohmic contact with said wafer surface at said third layer at an area in said notch; an auxiliary electrode displaced from said second electrode and disposed on said third layer and making ohmic metallic contact therewith at an area on said wafer surface extending along the circumferential margin of said wafer and having the shape of a semi-annulus, with the interruption being near said notch, said contact area of said auxiliary electrode having a width of about one order of magnitude above its distance from said contact area of second electrode disc; and a metallic connection interconnecting said auxiliary electrode and said second main electrode without contacting any semi-conductor material pertaining to said wafer.

11. Controllable semi-conductor device comprising: a single crystal semi-conductor wafer having first, second and third parallel layers with the first and second layers forming a p–n junction and the second and third layers forming another p–n junction, said first and third layers being of similar type conductivity; a first main electrode making ohmic metallic contact with said first layer only; a second main electrode disposed on a wafer surface at said third layer and making contact therewith at an area having an at least partially circular outer contour line, a zone of a conductivity type similar to that of said second layer extending beneath said second electrode following a similar contour and forming a third p–n junction with said third layer, said third p–n junction intersecting the wafer surface at a contour line approximately coinciding with said at least partially circular outer contour line, said second electrode having a recess, there being a free surface of said third layer at said recess; a metallic control electrode making ohmic contact with said third layer at an area within said recess; a metallic auxiliary electrode displaced from said second electrode and disposed on said third layer and making ohmic contact therewith at an area at least partially surrounding said circular area of contact of said main electrode at a distance of about 0.1 to 0.5 mm. from said contour line, said area of contact of said auxiliary electrode with said third layer having a minimum distance of 1.5 mm. from the area of contact of said control electrode; and a metallic connection interconnecting said auxiliary electrode and said second main electrode without contacting any semi-conductor material pertaining to said wafer.

12. Controllable semi-conductor device comprising: a single crystal semi-conductor wafer having first, second and third parallel layers with the first and second layers forming a p–n junction and the second and third layers forming another p–n junction, said first and third layers being of similar type conductivity; a first main electrode making ohmic metallic contact with said first layer only; a second main electrode disposed on said third layer, there being a layer zone beneath said second main electrode being of similar type conductivity as that of said second layer and extending into said third layer, so as to form a third p–n junction therewith, said second main electrode making metallic ohmic contact with said zone beneath thereof, said third p–n junction intersecting the wafer surface at a contour line approximately coinciding with the contour line outlined by the area wherein the second main electrode contacts the wafer surface, said second main electrode having a recess, there being a free surface of said third layer at said recess; a control electrode making ohmic metallic contact with said third layer at a wafer surface area in said recess; an auxiliary electrode displaced from said second electrode and disposed on said third layer and making metallic ohmic contact therewith in an area at least partially surrounding said area of contact of said second electrode at a distance of 0.1 to 0.5 mm. therefrom; and a metallic connection interconnecting said auxiliary electrode and said second main electrode without contacting any semi-conductor material pertaining to said wafer.

References Cited by the Examiner

UNITED STATES PATENTS

| | | | |
|---|---|---|---|
| 2,922,897 | 1/1960 | Maupin | 317—235 |
| 2,924,760 | 2/1960 | Herlet | 317—235 |
| 3,097,335 | 7/1963 | Schmidt | 317—235 |
| 3,124,703 | 3/1964 | Sylvan | 317—235 |
| 3,160,800 | 12/1964 | Smart | 317—235 |

JOHN W. HUCKERT, *Primary Examiner.*

DAVID J. GALVIN, *Examiner.*

A. M. LESNIAK, *Assistant Examiner.*